(12) United States Patent
Kawai

(10) Patent No.: US 9,881,768 B2
(45) Date of Patent: Jan. 30, 2018

(54) CHARGED PARTICLE BEAM SYSTEM WITH RECEPTACLE CHAMBER FOR CLEANING SAMPLE AND SAMPLE STAGE

(71) Applicant: JEOL Ltd., Tokyo (JP)

(72) Inventor: Shuji Kawai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/233,181

(22) Filed: Aug. 10, 2016

(65) Prior Publication Data

US 2017/0133197 A1    May 11, 2017

(30) Foreign Application Priority Data

Aug. 12, 2015    (JP) .................. 2015-159395

(51) Int. Cl.
*H01J 37/16* (2006.01)
*H01J 37/00* (2006.01)
(Continued)

(52) U.S. Cl.
CPC .............. *H01J 37/266* (2013.01); *G01L 7/00* (2013.01); *H01J 37/185* (2013.01); *H01J 37/26* (2013.01);
(Continued)

(58) Field of Classification Search
CPC .. H01J 27/16; H01J 27/18; H01J 29/70; H01J 37/06; H01J 37/073; H01J 37/141; H01J 37/185; H01J 37/20; H01J 37/222; H01J 37/244; H01J 37/266; H01J 37/3005; H01J 37/32; H01J 37/32082; H01J 37/32412; H01J 37/32862; H01L 21/6719; H01L 21/02126; H01L 21/02203; H01L 21/02216; H01L 21/02282; H01L 21/02304; H01L 21/02337; H01L 21/0234; H01L 21/02362; H01L 21/2236; H01L 21/31695; H01L 21/67161; H01L 21/67167; H01L 21/67184; H01L 21/67196; H01L 21/67742; H01L 21/76807
USPC ... 250/310, 424, 492.1, 492.2, 611, 396 ML, 250/396 R, 397, 398, 423 R, 441.11, 250/492.21, 493.1, 504 R
See application file for complete search history.

(56) References Cited

U.S. PATENT DOCUMENTS 5,401,974 A * 3/1995 Oae .................. B82Y 10/00
250/424
5,510,624 A * 4/1996 Zaluzec ............... G01N 1/32
250/441.11
(Continued)

FOREIGN PATENT DOCUMENTS

JP    2009266697 A    11/2009

*Primary Examiner* — David A Vanore
(74) *Attorney, Agent, or Firm* — The Webb Law Firm

(57) ABSTRACT

A charged particle beam system capable of reducing contamination has a sample chamber (15) in which the sample (S) is irradiated with a charged particle beam and a receptacle chamber (21) which is connected into the sample chamber (15) via an isolation valve (25) and is connected to the ambient via a door (26). A transport mechanism (22) conveys the sample (S) from the ambient via the door (26) into the receptacle chamber (21) and via the isolation valve (25) into the sample chamber (15). A cleaning portion supplies active oxygen into the receptacle chamber which can then be evacuated by a vacuum pump.

6 Claims, 7 Drawing Sheets

(51) Int. Cl.
*H01J 37/26* (2006.01)
*G01L 7/00* (2006.01)
*H01J 37/18* (2006.01)
*H01J 37/32* (2006.01)

(52) U.S. Cl.
CPC ......... *H01J 37/32* (2013.01); *H01J 2237/022* (2013.01); *H01J 2237/201* (2013.01); *H01J 2237/2802* (2013.01)

(56) References Cited

U.S. PATENT DOCUMENTS

| | | | | |
|---|---|---|---|---|
| 5,578,821 | A * | 11/1996 | Meisberger | H01J 37/28 250/310 |
| 5,981,960 | A * | 11/1999 | Ooaeh | B82Y 10/00 250/398 |
| 7,241,993 | B2 * | 7/2007 | Nakasuji | G01N 23/225 250/310 |
| 7,358,511 | B2 * | 4/2008 | Sasaki | C23C 14/48 204/192.15 |
| 8,507,879 | B2 * | 8/2013 | Vane | H01J 37/02 250/492.1 |
| 2004/0020601 | A1 * | 2/2004 | Zhao | H01L 21/02126 156/345.32 |
| 2014/0231669 | A1 * | 8/2014 | Takahashi | H01J 27/18 250/424 |

\* cited by examiner

# CHARGED PARTICLE BEAM SYSTEM WITH RECEPTACLE CHAMBER FOR CLEANING SAMPLE AND SAMPLE STAGE

BACKGROUND OF THE INVENTION

Field of the Invention

The present invention relates to a charged particle beam system.

Description of Related Art

In an electron microscope or charged particle beam system (such as a transmission electron microscope (TEM), a scanning transmission electron microscope (STEM), or a scanning electron microscope (SEM)), an electron microscope image is obtained by irradiating a sample with an electron beam and detecting secondary electrons emitted from the sample, backscattered electrons, electrons transmitted through the sample, or scattered electrons.

In an electron microscope, when a sample is irradiated with an electron beam, contaminant materials adhering to the surfaces of the sample and of a sample stage interact with the electron beam. This may contaminate the sample surface. It is said that the contaminant materials are carbon-based molecules. If the surface of the sample is contaminated, intrinsic image contrast attributed to the sample cannot be easily derived. Furthermore, if the sample surface is contaminated during an analysis, such as electron dispersive spectroscopy (EDS) analysis or electron energy loss spectroscopy (EELS) analysis, signals not stemming from the sample may be detected and appear as system peaks.

In an attempt to suppress sample contamination as described above, JP-A-2009-266697, for example, discloses a technique for nondestructively cleaning the vacuum paths of an electron microscope by introducing active oxygen radicals into the vacuum paths.

Another technique for suppressing sample contamination is also known. In this technique, a sample and a sample stage on which the sample is secured are cleaned by the use of a cleaning device (i.e., sample contamination preventive device) prior to observation or analysis of the sample using an electron microscope. In this cleaning device, a plasma is directed onto the sample and the sample stage to etch their surfaces. Consequently, contaminant materials adhering to the surfaces of the sample and sample stage can be removed. During the plasma irradiation, the etching rate can be enhanced by introducing an inert gas such as Ar gas.

Where the above-described cleaning device is used, however, when the sample is transported into the sample chamber of the electron microscope from the cleaning device after cleaning the sample, the sample must be temporarily exposed to the atmosphere, which contains contaminant materials in quantity. When a sample is exposed to the atmosphere, the contaminant materials may adhere to the sample surface again, thus reducing the effect of suppressing sample contamination.

SUMMARY OF THE INVENTION

In view of the foregoing problem, the present invention has been made. One object associated with some aspects of the present invention is to provide a charged particle beam system capable of suppressing contamination of samples.

(1) A charged particle beam system associated with the present invention has a sample chamber in which at least one sample is irradiated with a charged particle beam, said charged particle beam system comprising: a receptacle chamber which is connected into the sample chamber via an isolation valve and in which the sample is accommodated; a transport mechanism for conveying the sample from the receptacle chamber into the sample chamber; an exhaust portion for vacuum pumping the receptacle chamber; and a cleaning portion for cleaning the sample accommodated in the receptacle chamber.

In this charged particle beam system, the cleaned sample can be carried into the sample chamber under an evacuated environment without exposing the sample to the atmosphere. Therefore, in this charged particle beam system, the probability that the contaminant materials will adhere to the sample again can be reduced greatly, for example, as compared with the case where a cleaned sample is introduced into the sample chamber after exposed to the atmosphere. Consequently, in this charged particle beam system, contamination of the sample can be reduced. This allows observation and analysis to be made while less affected by contamination.

(2) In one feature of this charged particle beam system, the cleaning portion may supply active oxygen into the receptacle chamber.

In this charged particle beam system, the contaminant materials adhering to the sample can be removed by chemically bonding the contaminant materials to active oxygen.

(3) In one feature of this charged particle beam system of (2) above, there may be further provided a controller for controlling both of the transport mechanism and the cleaning device. The controller may control the transport mechanism and the cleaning portion to supply active oxygen into the receptacle chamber while moving the sample.

In this charged particle beam system, active oxygen can be easily spread over the sample received in the receptacle chamber, thus enhancing the cleaning effect.

(4) In one feature of the charged particle beam system of (1) or (2), there may be further provided: a pressure gauge portion for measuring the pressure in the receptacle chamber; and a controller for controlling the cleaning portion. The controller may control the flow rate of a gas introduced into the receptacle chamber on the basis of results of measurements made by the pressure gauge portion, cause the introduced gas to be irradiated with a plasma, and cause active oxygen to be supplied into the receptacle chamber.

In this charged particle beam system, it is not necessary for the user to control the flow rate of the gas and, therefore, the sample can be cleaned easily.

(5) In one feature of the charged particle beam system of any one of (1) to (4), the at least one sample is plural in number. The receptacle chamber may accommodate the plural samples.

In this charged particle beam system, plural samples can be cleaned at the same time.

(6) In another feature of the charged particle beam system of (1), the cleaning portion may irradiate the sample with a plasma.

In this charged particle beam system, the contaminant materials on the sample surface can be etched away by irradiating the sample with a plasma.

DESCRIPTION OF THE INVENTION

The preferred embodiment of the present invention is hereinafter described in detail with reference to the drawings. It is to be understood that the embodiment described below is not intended to unduly restrict the content of the present invention delineated by the claims and that not all the configurations described below are essential constituent components of the invention.

1. Charged Particle Beam System

Figure 1:
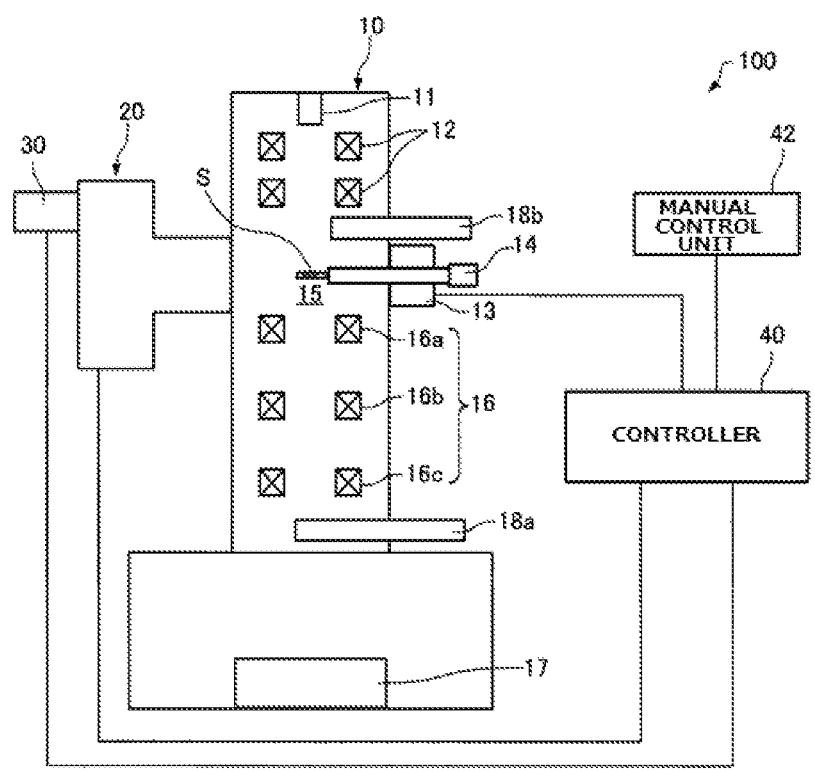
FIG. 1 is a schematic view, partly in block form, of a charged particle beam system associated with one embodiment of the present invention.

A charged particle beam system associated with one embodiment of the present invention is first described by referring to FIG. 1, which schematically shows the charged particle beam system, 100.

As shown in FIG. 1, the charged particle beam system 100 includes a body portion 10, a transport portion 20, a cleaning portion 30, a controller 40, and a manual control unit 42.

The body portion 10 has an electron beam source 11, an illumination lens system 12, a sample stage 13, a sample holder 14, an imaging lens system 16, an image capture device 17, an STEM detector 18a, and a secondary electron detector 18b.

The electron beam source 11 produces an electron beam that is one example of charged particle beam. For example, the electron beam source 11 is an electron gun that emits an electron beam by accelerating electrons, emitted from a cathode, by means of an anode.

The electron beam produced by the electron beam source 11 is focused onto at least one sample S by the illumination lens system 12. In a sample chamber 15, the electron beam is made to hit the sample S.

The charged particle beam system 100 may be configured including a deflector (not shown) for causing the electron beam (electron probe) focused by the illumination lens system 12 to be scanned over the sample S.

In the sample chamber 15, the sample stage 13 holds the sample S. In the illustrated example, the sample stage 13 holds the sample S via the sample holder 14. The sample stage 13 places the sample S between the top and bottom polepieces (both of which are not shown) of an objective lens 16a. The sample stage 13 can move and stop the sample holder 14 (and thus the sample S, too), and can place the sample S in position. The operation of the sample stage 13 is under control of the controller 40.

The interior of the sample chamber 15 is vacuum pumped by vacuum pumping equipment (not shown), which can be an ion pump, a turbomolecular pump, or the like.

The imaging lens system 16 operates to focus the electron beam transmitted through the sample S. The imaging lens system 16 is composed of the objective lens 16a, an intermediate lens 16b, and a projector lens 16c.

The image capture device 17 obtains a TEM image focused by the imaging lens system 16, for example, by the use of a CCD camera.

The STEM detector 18a detects the intensity of wave transmitted or diffracted through each point on the sample S by scanning the electron probe over the sample S. The output signal from the STEM detector 18a is stored as STEM image data in a storage device (not shown) while being correlated with information about the electron beam position on the sample.

The secondary electron detector 18b detects secondary electrons emitted from each point on the sample S by scanning the electron probe over the sample S. The output signal from the secondary electron detector 18b is stored as SEM image data in the storage device (not shown) while being correlated with information about the beam position on the sample.

As described previously, the charged particle beam system 100 has the functions of all of a transmission electron microscope (TEM), a scanning transmission electron microscope (STEM), and a scanning electron microscope (SEM). Note that the charged particle beam system 100 only needs to have the functions of at least one of these instruments TEM, STEM, and SEM.

The transport portion 20 transports the sample S present outside of the sample chamber 15 into the sample chamber 15. The cleaning portion 30 cleans the sample S conveyed in the sample chamber 15. The controller 40 controls the sample stage 13, transport portion 20, and cleaning portion 30. The transport portion 20, cleaning portion 30, and controller 40 are described in further detail below.

Figure 2:
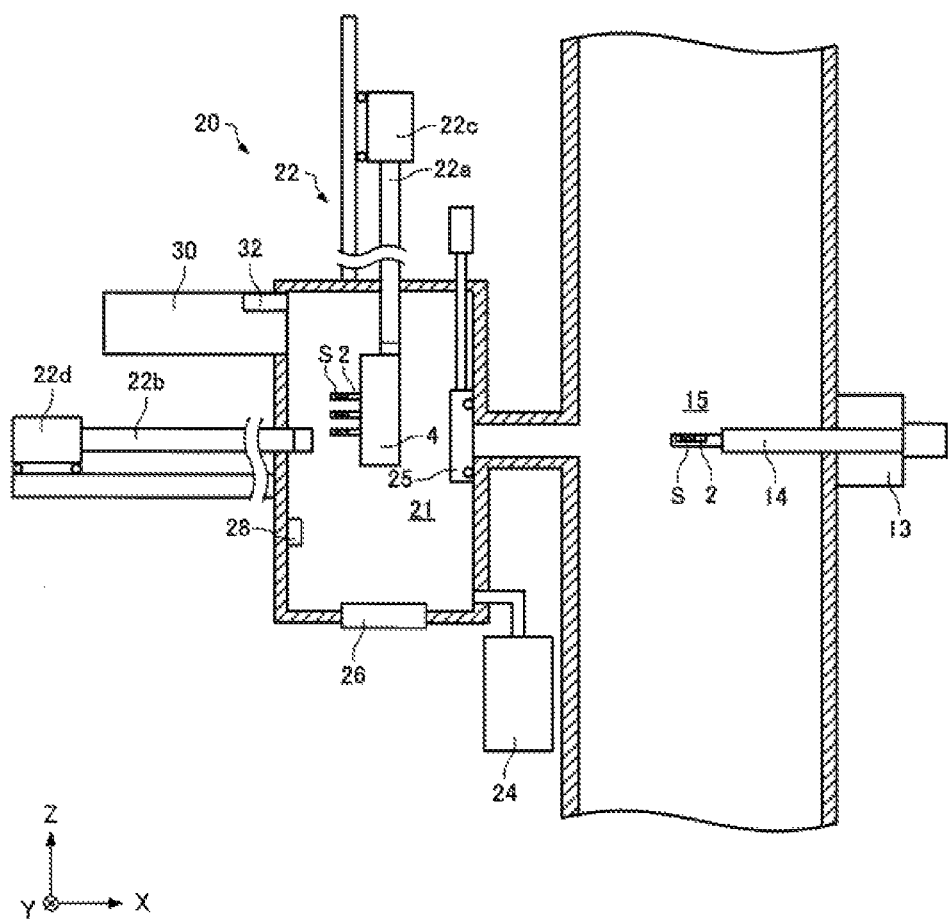
FIG. 2 is a schematic cross-sectional view of a transport portion and a cleaning portion of the charged particle beam system shown in FIG. 1.

FIG. 2 schematically shows the transport portion 20 and cleaning portion 30. In FIG. 2, X-, Y-, and Z-axes are shown as three mutually perpendicular axes. The Z-axis runs parallel to the optical axis of the optical system of the body portion 10.

As shown in FIG. 2, the transport portion 20 has a receptacle chamber 21, a transport mechanism 22, an exhaust portion 24, a door portion 26, and a position sensor 28.

The receptacle chamber 21 is a space to accommodate the sample or samples S. In the charged particle beam system 100, after introduced into the receptacle chamber 21 from the outside, the sample S is introduced into the sample chamber 15 from the receptacle chamber 21. The receptacle chamber 21 is connected into the sample chamber 15 via an isolation valve 25. The receptacle chamber 21 and sample chamber 15 are placed in communication with each other by opening the isolation valve 25. The receptacle chamber 21 and sample chamber 15 are isolated from each other by closing the isolation valve 25. Use of the isolation valve 25 permits the vacuum in the receptacle chamber 21 to be broken independently without affecting the sample chamber 15. The isolation valve 25 may be controlled by the controller 40. The isolation valve 25 may be mounted in a pipe that interconnects the receptacle chamber 21 and the sample chamber 15.

The sample S is held to the sample stage 2, which in turn is supported by a sample stage container (sample stage support) 4. Under this condition, the sample S secured to the sample stage 2 is accommodated in the receptacle chamber 21.

Figure 3:
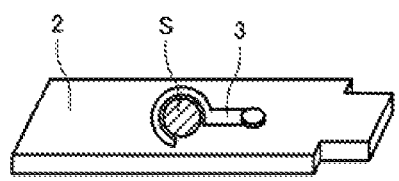
FIG. 3 is a schematic perspective view of a sample stage of the charged particle beam system shown in FIG. 1.
Figure 4:
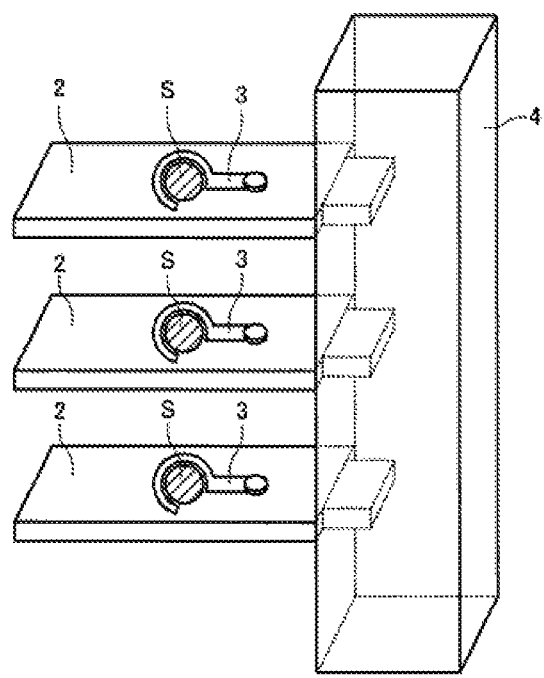
FIG. 4 is a schematic perspective view of a sample stage container of the charged particle beam system shown in FIG. 1.

FIG. 3 is a schematic perspective view of the sample stage 2. FIG. 4 is a schematic perspective view of the sample stage container 4.

As shown in FIG. 3, the sample S is held to the sample stage 2 by a securing member 3. For example, the securing member 3 is a leaf spring or a C-ring.

As shown in FIG. 4, the sample stage container 4 can mechanically support plural sample stages 2. The sample stage container 4 is provided with recesses. The sample stages 2 are supported to the sample stage container 4 by inserting salient portions of the sample stages 2 into the recesses of the container 4. Because plural sample stages 2 can be supported to the sample stage container 4, plural samples S can be received in the receptacle container 21.

The transport mechanism 22 conveys each sample S from the receptacle chamber 21 into the sample chamber 15. As shown in FIG. 2, the transport mechanism 22 is configured including a first transport rod 22a, a second transport rod 22b, a first mechanical drive portion 22c, and a second mechanical drive portion 22d.

The first transport rod 22a moves the sample S in the Z-axis direction by moving the sample stage container 4 in the Z-axis direction while holding the container 4. The first transport rod 22a has a grip portion at its front end, the grip portion permitting one to grip the sample stage container 4.

The first mechanical drive portion 22c drives the first transfer rod 22a. The first mechanical drive portion 22c is configured including a motor or the like for moving the first transfer rod 22a in the Z-axis direction. The sample stage container 4 can be moved in the Z-axis direction by driving the first transfer rod 22a by means of the first mechanical drive portion 22c. The first mechanical drive portion 22c is controlled by the controller 40.

The second transfer rod 22b is operative to move the sample S in the X-axis direction. The second transfer rod 22b has a grip portion at its front end, the grip portion allowing one to grip the sample stage 2 (and the sample S). The second transfer rod 22b takes the sample stage 2 (and the sample S) out of the sample stage container 4 held by the first transfer rod 22a and moves the sample stage 2 (and the sample S) in the X-axis direction.

The second mechanical drive portion 22d is operative to drive the second transport rod 22b, and is configured including a motor or the like for moving the second transport rod 22b in the X-axis direction. The second mechanical drive portion 22d can move the sample stage 2 (and the sample S) in the X-axis direction by driving the second transfer rod 22b by means of the second mechanical drive portion 22d which, in turn, is controlled by the controller 40.

The exhaust portion 24 provides vacuum pumping of the receptacle chamber 21. The exhaust portion 24 is a vacuum pumping unit such as a turbomolecular pump, an oil sealed rotary vacuum pump, or a scroll pump. The receptacle chamber 21 can be evacuated to a vacuum condition by vacuum pumping the receptacle chamber 21 using the exhaust portion 24.

The door portion 26 is provided with an opening or connection port for introducing the sample stage container 4 into the receptacle chamber 21. The sample stage container 4 can be introduced into the receptacle chamber 21 by opening the door portion 26. The interior of the receptacle chamber 21 can be made airtight by closing the door portion 26.

The position sensor 28 is used to identify the position of each sample stage 2 (and the sample S) supported to the sample stage container 4. For example, the position sensor 28 has a light emitting portion and a light receiving portion. If one sample stage 2 supported to the sample stage container 4 passes between the light emitting portion and the light receiving portion, the light emitted from the light emitting portion is blocked. Therefore, the position of this sample stage 2 can be identified on the basis of the output signal from the position sensor 28 (i.e., the detection signal from the light receiving portion) by causing the position sensor 28 to detect the signal while moving the sample stage container 4. No restriction is placed on the means of identifying the position of the sample stage 2.

The output signal from the position sensor 28 is sent to the controller 40. The controller 40 identifies the position of the sample stage 2, based on the output signal from the position sensor 28. Where plural sample stages 2 are supported to the sample stage container 4, the controller 40 identifies the positions of the sample stages 2. Information about the positions of the sample stages 2 is displayed on a display device (not shown).

The cleaning portion 30 cleans the samples S received in the receptacle chamber 21. When the receptacle chamber 21 has been vacuum pumped by the exhaust portion 24, the cleaning portion 30 supplies active oxygen (active oxygen radicals) into the receptacle chamber 21. The active oxygen supplied in the receptacle chamber 21 passes through the receptacle chamber 21 and collides with the samples S, the sample stages 2, and other structural objects within the receptacle chamber 21. Consequently, the active oxygen is chemically bonded to the contaminant materials such as carbon molecules on the surfaces of the samples S, sample stages 2, and structural objects. The contaminant materials chemically bonded to the active oxygen are vented from the exhaust portion 24.

The cleaning portion 30 lets in outside air and irradiates it with a plasma to thereby activate the oxygen molecules within the air. Thus, active oxygen is generated. The generated active oxygen passes through the receptacle chamber 21 from the cleaning portion 30 and is vented from the exhaust portion 24. On its way from the cleaning portion 30 to the exhaust portion 24, the active oxygen generated in the cleaning portion 30 is chemically bonded to the contaminant materials. The active oxygen can be supplied to the whole of the receptacle chamber 21 by mounting the cleaning portion 30 at the end of the receptacle chamber 21 in the +Z-axis direction and forming the exhaust portion 24 (exhaust port) at the end of the receptacle chamber 21 in the −Z-axis direction as shown in FIG. 2. The cleaning portion 30 may introduce a gas other than the atmosphere. For example, the cleaning portion 30 may introduce a gas such as oxygen gas or hydrogen gas and irradiate the gas with a plasma to generate active oxygen (radicals) or the like.

The cleaning portion 30 has a pressure gauge portion 32 for measuring the pressure in the receptacle chamber 21. The output signal from the pressure gauge portion 32 is sent to the controller 40, which in turn controls the flow rate of the gas introduced into the receptacle chamber 21 on the basis of the output signal from the pressure gauge portion 32.

The controller 40 controls the sample stage 13, transport portion 20 (transport mechanism 22), and cleaning portion 30. The controller 40 performs processing to convey the sample S into the sample chamber 15 by controlling the transport portion 20 and cleaning portion 30. This processing of the controller 40 to convey the sample S into the sample chamber 15 will be described in detail later (see "2. Operation of Charged Particle Beam System"). The controller 40 may be made of dedicated circuitry to perform the above-described processing and control operations. Alternatively, the controller 40 may be made of a CPU (central processing unit) which executes control programs stored in a storage device (not shown), whereby the controller serves as a computer and performs the above-described processing and control operations.

The manual control unit 42 performs processing to obtain a control signal responsive to a user's manipulation and to send the signal to the controller 40. The functions of the manual control unit 42 can be accomplished by buttons, keys, a touch panel display, a microphone, or the like.

2. Operation of Charged Particle Beam System

The operation of the charged particle beam system 100 is next described by referring to some figures. A process for preparing the sample S that is subject to observation and analysis made with the charged particle beam system 100 is first described.

The sample S that is subject to observation and analysis made with the electron microscope can be prepared by various techniques. A process for preparing the sample using an FIB (focused ion beam) system is described now. With the FIB system, an observation position within a bulk sample is identified using an SIM (scanning ion microscope) image or SEM image. The bulk sample is processed by an FIB (focused ion beam) such that size and film thickness capable of being observed under an electron microscope are achieved. Thus, the sample S is prepared and secured to a sample mesh either inside or outside of the FIB system.

The sample mesh having the sample S secured thereon is held to at least one sample stage 2 by the securing member 3 as shown in FIG. 3. The sample stage 2 having the sample S secured thereon is supported to the sample stage container 4 by inserting a salient portion of the sample stage 2 into a recessed portion of the sample stage container 4 as shown in FIG. 4. The sample stage container 4 can support plural such sample stages 2.

Figure 5:
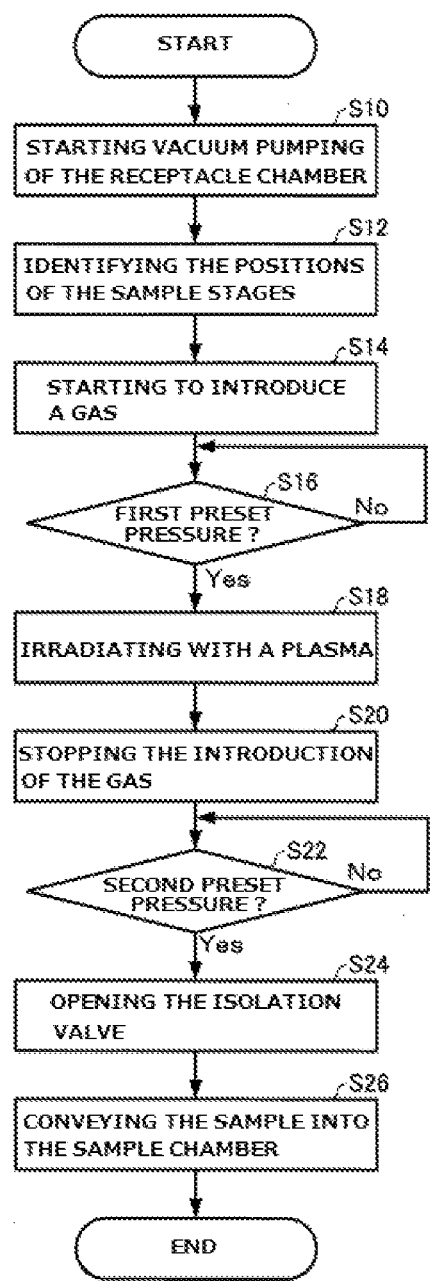
FIG. 5 is a flowchart illustrating one example of a subroutine performed by the charged particle beam system shown in FIG. 1.
Figure 6:
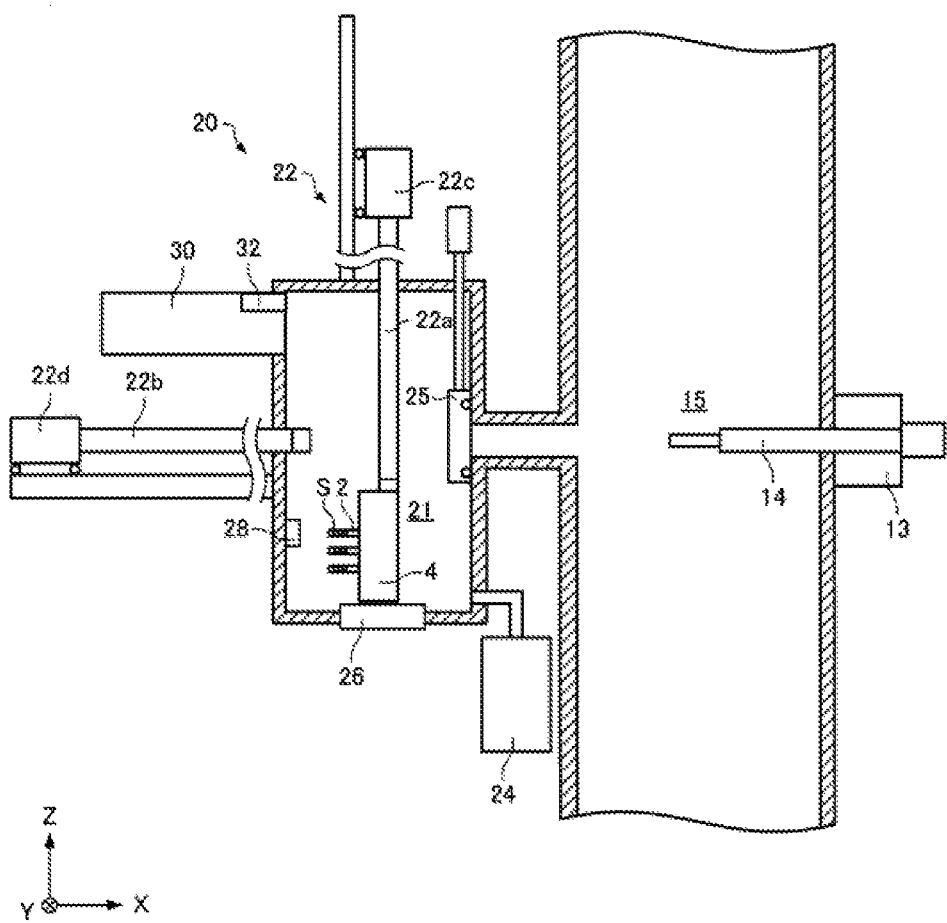
FIGS. 6, 7, and 8 are schematic cross-sectional views similar to FIG. 2, illustrating various operational states of the charged particle beam system.
Figure 7:
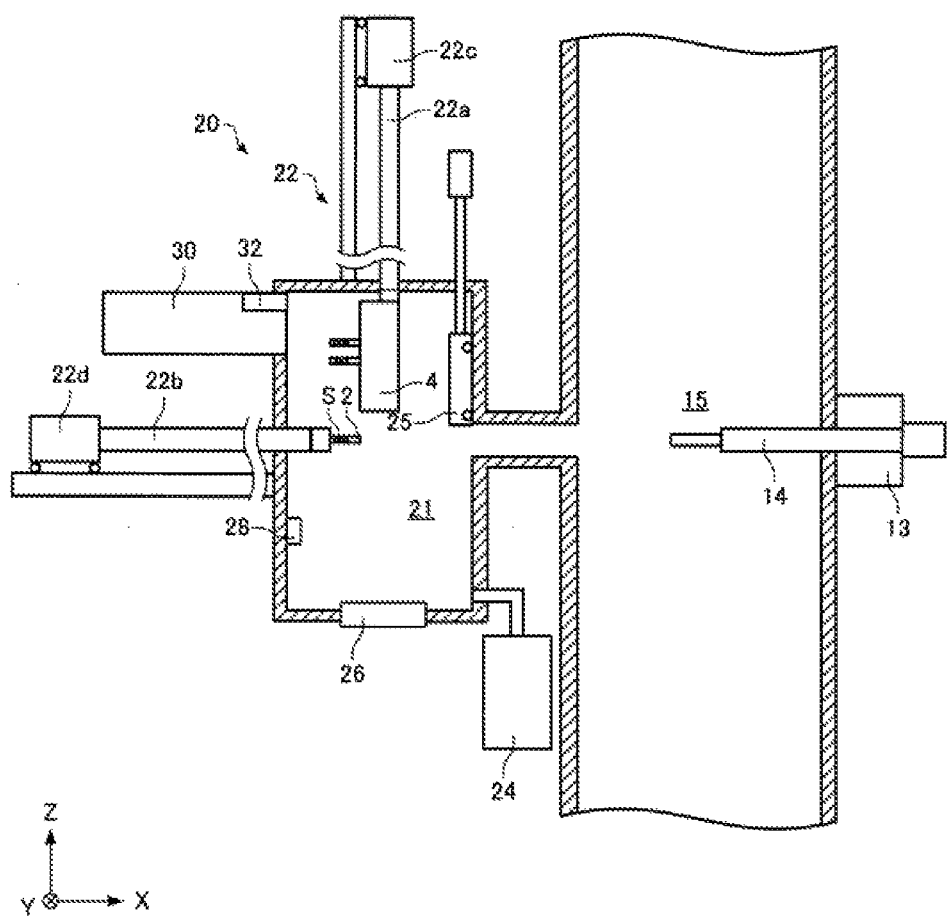
Figure 8:
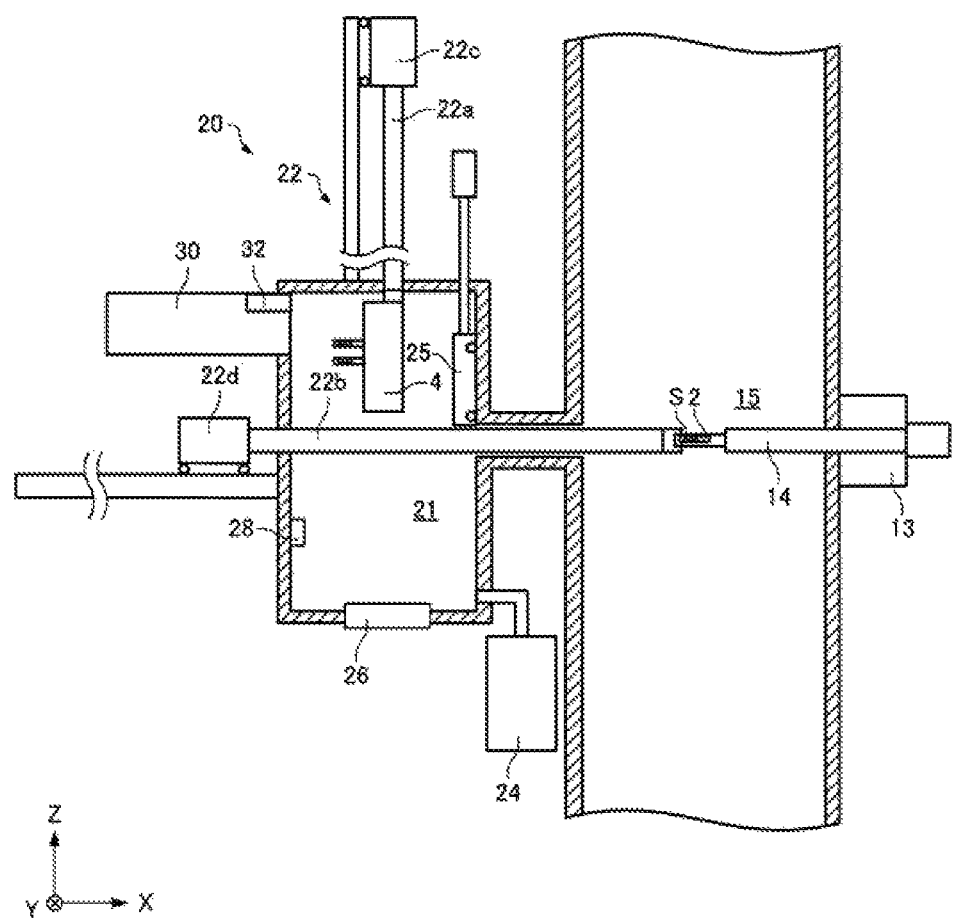

A process sequence for conveying each sample S into the sample chamber 15 is next described. FIG. 5 is a flowchart illustrating one example of subroutine performed by the charged particle beam system 100. FIGS. 6-8 illustrate the operation of the charged particle beam system 100.

As shown in FIG. 6, the sample support stage 4 providing support of the plural sample stages 2 is introduced into the receptacle chamber 21 from the door portion 26 and attached to the first transfer rod 22a.

When the door portion 26 is closed, the controller 40 activates the exhaust portion 24 to start vacuum pumping of the receptacle chamber 21 (step S10). The controller 40 may accept a control signal arising from the manual control unit 42 in response to a user's manipulation to start the vacuum pumping, activate the exhaust portion 24, and initiate the vacuum pumping of the receptacle chamber 21.

The controller 40 then identifies the positions of the sample stages 2 in response to the output signal from the position sensor 28 (step S12). The controller 40 controls the first transfer rod 22a, accepts the output signal from the position sensor 28 while moving the sample stage container 4, and identifies the positions of the sample stages 2. The controller 40 displays positional information about the sample stages 2 on the display device.

Then, the controller 40 controls the cleaning portion 30 and starts to introduce a gas (such as outside air) into the receptacle chamber 21 (step S14). The controller 40 controls the flow rate of the gas on the basis of the results of measurements of the pressure in the receptacle chamber 21 made by the pressure gauge portion 32 such that the pressure in the receptacle chamber 21 becomes equal to a first preset pressure that is a pressure value appropriate for generation of active oxygen.

The controller 40 monitors the pressure in the receptacle chamber 21 and introduces the gas such that the pressure in the receptacle chamber 21 becomes equal to the first preset pressure if the decision at step S16 is negative (No).

If the decision at step S16 is affirmative (Yes) indicating that the pressure in the receptacle chamber 21 has become equal to the first preset pressure, the controller 40 causes the gas to be irradiated with a plasma (step S18). This activates the oxygen molecules within the gas (outside air), producing active oxygen. The produced active oxygen travels through the receptacle chamber 21, collides with the samples S, sample stages 2, and structural objects within the receptacle chamber 21, and is chemically bonded to the contaminant materials on their surfaces. The contaminant materials chemically bonded to active oxygen are vented from the exhaust portion 24. The plasma irradiation is performed for a preset time under control of the controller 40. This preset time can be any arbitrary period, e.g., from approximately 1 to 3 minutes. When the preset time has passed since the start of the plasma irradiation, the controller 40 controls the cleaning portion 30 and stops the plasma irradiation.

In the present subroutine, the controller 40 may control the transport mechanism 22 and cleaning portion 30 to supply active oxygen into the receptacle chamber 21 while moving the samples S (and the sample stages 2). For example, when the cleaning portion 30 is producing active oxygen, the controller 40 may move the sample stage container 4 by the first transport rod 22a. Consequently, active oxygen can be readily distributed to the samples S and to the sample stages 2, thus enhancing the cleaning effect. The controller 40 may move the sample stage container 4 forward and rearward along the Z-axis (i.e., in the positive and negative directions of the Z-axis). Furthermore, the controller 40 may reciprocate the sample stage container 4 in the Z-axis direction.

The controller 40 controls the cleaning portion 30 to stop the introduction of the gas, for example, simultaneously with the operation for stopping the plasma irradiation (step S20). The pressure in the receptacle chamber 21 drops because of the stoppage of the introduction of the gas.

The controller 40 monitors the pressure in the receptacle chamber 21 and causes the exhaust portion 24 to vacuum pump the receptacle chamber 21 until the pressure in the receptacle chamber 21 reaches a second preset pressure if the decision at step S16 is No. For example, the second preset pressure is set equal to the pressure in the sample chamber 15.

If the decision at step S22 is Yes, indicating that the pressure in the receptacle chamber 21 has become equal to the second preset pressure, the controller 40 causes the isolation valve. 25 to be opened as shown in FIG. 7 (step S24).

The controller 40 then controls the second transfer rod 22b to convey the specified sample S into the sample chamber 15 (step S26). The sample S can be specified, for example, by the user via the manual control unit 42. The controller 40 controls the first transfer rod 22a and the second transfer rod 22b such that the sample stage 2 to which the specified sample S is secured is gripped by the second transfer rod 22b. Then, the controller 40 causes the second transfer rod 22b to be moved to convey the sample stage 2 having the sample S secured thereon into the sample chamber 15 as shown in FIG. 8. The controller 40 then causes the sample stage 2 to be held at the front end of the sample holder 14.

Because of the processing steps described so far, the sample S can be conveyed into the sample chamber 15. After transporting the sample S into the sample chamber 15, the controller 40 returns the second transfer rod 22b into the receptacle chamber 21 and closes the isolation valve 25.

In the above-described example, the controller 40 provides automatic and sequential control of the steps S10-S26. Alternatively, the transfer rods 22a and 22b may be manually manipulated to move the sample S. Also, the cleaning portion 30 and the isolation valve 25 may be manually manipulated.

The charged particle beam system 100 has the following features. In the charged particle beam system 100, the receptacle chamber 21 is connected into the sample chamber 15 via the isolation valve 25. The cleaning portion 30 cleans the sample S received in the receptacle chamber 21. The transport mechanism 22 conveys the sample S from the receptacle chamber 21 into the sample chamber 15. Therefore, in the charged particle beam system 100, the cleaned sample S can be conveyed into the sample chamber 15 under an evacuated environment without exposing the sample to the atmosphere. Therefore, the probability that contaminant materials will adhere to the sample S again can be dramatically reduced, for example, as compared with the case where a cleaned sample is introduced into the sample chamber after being exposed to the atmosphere. Consequently, in the charged particle beam system 100, contamination of the sample S can be reduced. This allows observation and analysis to be made while less affected by contamination.

Furthermore, in the charged particle beam system 100, plural samples S can be accommodated in the receptacle chamber 21 and cleaned at once. This makes it unnecessary to clean each sample, for example, whenever the sample is replaced. Hence, user's labor can be reduced.

Additionally, in the charged particle beam system 100, the cleaning portion 30 supplies active oxygen into the receptacle chamber 21. Therefore, in the charged particle beam system 100, contaminant materials adhering to the sample S can be removed by chemically bonding the contaminant materials to the active oxygen.

Further, in the charged particle beam system 100, plural samples S can be accommodated in the receptacle chamber 21 and so the plural samples S can be cleaned at the same time.

Moreover, in the charged particle beam system 100, the controller 40 controls the transport mechanism 22 and cleaning portion 30 to supply active oxygen into the receptacle chamber 21 while moving the samples S. Therefore, in the charged particle beam system 100, active oxygen can be more easily distributed to the samples S, for example, as compared with the case where active oxygen is supplied into the receptacle chamber without moving the samples. In consequence, the cleaning effect can be enhanced.

Yet further, in the charged particle beam system 100, the controller 40 controls the flow rate of the gas introduced into the receptacle chamber 21 on the basis of the results of measurements made by the pressure gauge portion 32, causes the introduced gas to be irradiated with a plasma, and causes active oxygen to be supplied into the receptacle chamber 21. Consequently, in the charged particle beam system 100, the user is not required to control the flow rate of the gas. Hence, the samples S can be cleaned easily.

It is to be understood that the present invention is not restricted to the foregoing embodiment but rather can be practiced in various modified forms without departing from the scope and gist of the invention.

In the above embodiment, the cleaning portion 30 cleans each sample S by supplying active oxygen into the receptacle chamber 21. The method of cleaning the sample S is not restricted to this method. For example, the cleaning portion 30 may irradiate the samples S with a plasma to clean them. Contaminant materials on the surface of each sample S can be etched away by irradiating the sample S with a plasma. Accordingly, contamination of the sample S can be reduced. This allows observation and analysis to be performed while less affected by contamination. When each sample S is irradiated with a plasma, the cleaning portion 30 may introduce an inert gas such as Ar gas. Consequently, the etch rate can be enhanced.

Furthermore, in the above embodiment, when the cleaning portion 30 is supplying active oxygen to the samples S, the isolation valve 25 is closed. Alternatively, when the cleaning portion 30 is supplying active oxygen, the isolation valve 25 may be opened. This makes it possible to remove contaminant materials on the surfaces of structural objects inside the sample chamber 15 while removing the contaminant materials on the samples S and on the sample stage 2 received in the receptacle chamber 21. Consequently, contamination of the samples S can be reduced. Thus, observations and analysis can be performed while less affected by contamination.

In addition, in the above embodiment, active oxygen is generated and the samples S are cleaned by introducing a gas and irradiating it with a plasma after checking the positions of the sample stages 2. Alternatively, a check of the positions of the sample stages 2 and cleaning of the samples S may be done at the same time.

The present invention embraces configurations substantially identical (e.g., in function, method, and results or in purpose and advantageous effects) with the configurations described in the embodiment of the invention. Furthermore, the invention embraces configurations described in the embodiment and including portions which have non-essential portions replaced. In addition, the invention embraces configurations which produce the same advantageous effects as those produced by the configurations described in the embodiment or which can achieve the same objects as the configurations described in the embodiment. Further, the invention embraces configurations which are similar to the configurations described in the embodiment except that well-known techniques have been added.

Having thus described my invention with the detail and particularity required by the Patent Laws, what is desired protected by Letters Patent is set forth in the following claims.

The invention claimed is:

1. A charged particle beam system having a sample chamber in which at least one sample is irradiated with a charged particle beam, said charged particle beam system comprising:
   a receptacle chamber (21) which is connected into the sample chamber (15) via an isolation valve (25) and in which the sample is accommodated;
   a door (26) between the receptacle chamber and the ambient,
   a transport mechanism (22) for conveying the sample via the door into the receptacle chamber and from the receptacle chamber via the isolation valve into the sample chamber;
   an exhaust portion (24) for vacuum pumping the receptacle chamber; and
   a cleaning portion (30) for cleaning the sample accommodated in the receptacle chamber.

2. The charged particle beam system as set forth in claim 1, wherein said cleaning portion supplies active oxygen via an active oxygen source into said receptacle chamber.

3. The charged particle beam system as set forth in claim 2, further comprising a controller for controlling both of said transport mechanism and said cleaning portion, and wherein the controller controls the transport mechanism and the cleaning portion to supply active oxygen into the receptacle chamber while moving the sample.

4. The charged particle beam system as set forth in claim 1, further comprising:
   a pressure gauge portion for measuring the pressure in said receptacle chamber;
   an active oxygen source and means for generating a plasma, and
   a controller for controlling said cleaning portion,
   wherein the controller controls the flow rate of a gas introduced into the receptacle chamber on the basis of results of measurements made by the pressure gauge portion, causes the introduced gas to be irradiated with a plasma, and causes active oxygen to be supplied into the receptacle chamber.

5. The charged particle beam system as set forth in claim 1, wherein said receptacle chamber can accommodate the plural samples and the transport mechanism (22) is provided with a sample stage container (4) having recesses for receiving plural sample stages (2).

6. The charged particle beam system as set forth in claim 1, wherein said cleaning portion includes means for irradiating the sample with a plasma.

\* \* \* \* \*